(12) United States Patent
Sieber et al.

(10) Patent No.: US 10,292,304 B2
(45) Date of Patent: May 14, 2019

(54) ANTENNA ARRANGEMENT HAVING A FAN UNIT

(71) Applicant: EBM-PAPST ST. GEORGEN GMBH & CO. KG, St. Georgen (DE)

(72) Inventors: Sabrina Sieber, VS-Villingen-Schwenningen (DE); Rainer Strohm, St. Georgen (DE)

(73) Assignee: ebm-papst St. Georgen GmbH & Co. KG, St. Georgen (DE)

( * ) Notice: Subject to any disclaimer, the term of this patent is extended or adjusted under 35 U.S.C. 154(b) by 122 days.

(21) Appl. No.: 15/316,791

(22) PCT Filed: May 28, 2015

(86) PCT No.: PCT/EP2015/061810
§ 371 (c)(1),
(2) Date: Dec. 13, 2016

(87) PCT Pub. No.: WO2015/189040
PCT Pub. Date: Dec. 17, 2015

(65) Prior Publication Data
US 2018/0220550 A1    Aug. 2, 2018

(30) Foreign Application Priority Data

Jun. 13, 2014    (DE) .................. 10 2014 108 396

(51) Int. Cl.
*H01Q 1/02*    (2006.01)
*H01Q 1/24*    (2006.01)
(Continued)

(52) U.S. Cl.
CPC ....... *H05K 7/20172* (2013.01); *F04D 25/068* (2013.01); *F04D 25/166* (2013.01);
(Continued)

(58) Field of Classification Search
None
See application file for complete search history.

(56) References Cited

U.S. PATENT DOCUMENTS 5,460,571 A    10/1995  Kato ............................. 454/184
5,655,375 A     8/1997  Ju ..................................... 62/3.6
(Continued)

FOREIGN PATENT DOCUMENTS

GB           2289827 A       11/1995

OTHER PUBLICATIONS

AC Tubeaxial Fan Tray, embpapst, 2006 http://catalog.ebmpapst.us/allpdfs/FT170AC.pdf (Year: 2006).*
(Continued)

*Primary Examiner* — Jianxun Yang
(74) *Attorney, Agent, or Firm* — Dickinson Wright PLLC

(57) ABSTRACT

The invention relates to an antenna arrangement (1) having an antenna arrangement housing (12), in which antenna arrangement housing (12) there are arranged an antenna (14), antenna electronics (16) for driving the antenna (14), and a fan unit (30) for active cooling of the antenna electronics (16), which fan unit (30) comprises a fan housing (40) having a plurality of fan unit side surfaces (41 to 48), which comprise a first fan unit housing side surface (41) and a second fan unit side surface (42; 43, 45), in which fan unit housing (40) there are arranged at least two fans (50), wherein the fan unit housing (40) has fluid passage openings (61, 62) on the first fan unit housing side surface (41) and on the second fan unit housing side surface (42; 43, 45) in order to permit a fluid (18) to flow through the fluid passage openings (61, 62).

29 Claims, 11 Drawing Sheets

(51) Int. Cl.
*H01Q 1/42* (2006.01)
*H05K 7/20* (2006.01)
*H05K 9/00* (2006.01)
*F04D 25/06* (2006.01)
*F04D 25/16* (2006.01)
*F04D 27/00* (2006.01)
*F04D 29/52* (2006.01)
*F04D 29/60* (2006.01)
*F04D 29/70* (2006.01)
*H04B 1/036* (2006.01)

(52) U.S. Cl.
CPC ......... *F04D 27/001* (2013.01); *F04D 27/004* (2013.01); *F04D 29/522* (2013.01); *F04D 29/602* (2013.01); *F04D 29/703* (2013.01); *H01Q 1/02* (2013.01); *H01Q 1/42* (2013.01); *H04B 1/036* (2013.01); *H05K 9/0041* (2013.01); *H01Q 1/246* (2013.01)

(56) References Cited

U.S. PATENT DOCUMENTS

| | | | |
|---|---|---|---|
| 6,427,762 B2 | 8/2002 | Oyamada | 165/80.2 |
| 6,735,450 B1* | 5/2004 | Remmert | H04B 1/38 361/688 |
| 2001/0054494 A1 | 12/2001 | Oyamada | 165/80.2 |
| 2005/0041397 A1 | 2/2005 | Alford | 361/720 |
| 2005/0207121 A1 | 9/2005 | Egawa | 361/703 |
| 2005/0281005 A1* | 12/2005 | Carullo | H05K 7/1451 361/725 |
| 2011/0192580 A1 | 8/2011 | Tsuji et al. | 165/121 |

OTHER PUBLICATIONS

Wikipedia, "IP Code," last modified Dec. 3, 2016, pp. 1-7.
Alcatel-Lucent, Remote Radio Head RHH2x40-AWS, Aug. 2013, pp. 1-2.
EBM-PAPST "Ein Lüfter fuer alle Klimazonen der Welt", retrieved Mar. 2015, pp. 1-2.
EBM-PAPST UK-Ltd., "Fan Tray for Rack Applications," Sep. 2008, pp. 1-2.
Woodcock,"Embedded LNA Antenna," Jaybeam, 2007, 5 pp.
Huawei Technologies, "Base Station Antenna Catalogue"; © 2009; pp. 1-48.
Huawei Aggison Product Catalog, Nov. 2009, pp. 48 and 49.
EBM-PAPST-USA, IP68 Fans from EBM-PAPST, © 2013, pp. 1-15.
Jones Kalunga: The Question of Antenna & Radio Integration; Feb. 2014; pp. 1-2.
Linehan et al, The Next Step in Radio & Antenna Evolution; Dec. 2011, pp. 1-11.
Schroff-Pentair 04 Climate Control Produkt Katalog; Dec. 2013 cf. pp. 6-17.
Telemeter Electronic, "Lüfter and Lüfterzubehör"; Jan. 2013, pp. 1-20.
CSS Antenna Model X7CAP-465, Jun. 21, 2011, Edgewood, MD, pp. 1-3.
Raycap Model RxxDC-2065-PF-48 "Surge Protection RHH/ Integrated Antenna Radio Head," © 2013, pp. 1-4.

* cited by examiner

ANTENNA ARRANGEMENT HAVING A FAN UNIT

The invention relates to an antenna arrangement with a fan unit.

Antenna arrangements such as, for example, those for the GSM radio network (GSM—Global System for Mobile communications) are very sensitive to electronic & electrical components in the vicinity of the antenna. A major problem is so-called "passive intermodulation" (PIM=Passive Inter-Modulation) which can arise due to electrical and electronic components in the vicinity of the antenna or even due to an unsuitable housing material, and can lead to a significant weakening of the power of the antenna. Further, high performance requirements are placed on the corresponding antenna arrangements, since they are exposed to bad weather and may be installed at altitudes up to 3,000 meters above sea level. For this reason, such antenna arrangements in the communications-IT sector have, hitherto, been preferably cooled passively or from outside the antenna arrangement.

Due to the ever-denser space utilization in antenna arrangements, good cooling of the antenna arrangement is necessary.

It is therefore an object of the invention to make available a novel antenna arrangement.

In accordance with the invention, this object is achieved by an antenna arrangement according to claim 1.

Such an antenna arrangement makes possible active cooling of the antenna electronics. This has led to significantly better cooling of the antenna electronics than was previously possible with passive cooling. Despite active cooling of the antenna electronics, any negative influence upon the antenna can be avoided.

According to an embodiment of the invention, the antenna arrangement has an antenna arrangement housing, in which are arranged an antenna, antenna electronics for driving the antenna, and a fan unit for active cooling of the antenna electronics. The fan unit has a fan unit housing containing a plurality of fan unit housing side faces, including a first fan unit side face and a second fan unit side face. At least two fans are arranged in the fan unit housing. Fluid passage openings are provided on the first fan unit side face and on the second fan unit side face, in order to permit streaming of fluid through the fluid passage openings.

According to an embodiment, the fan unit housing has a housing side face oriented toward the antenna, the side face having apertures formed therein, the maximum dimension of each of the apertures being than 5.0 cm, preferably less than 3.0 cm.

According to an embodiment, a control device is provided in the fan unit housing, and is connected via electrical leads with the fans, in order to control them, the control device preferably also being electrically connected with a temperature sensor.

According to an embodiment, the control device has a circuit board which is configured to control the at least two fans.

According to an embodiment, the circuit board is arranged in a circuit board housing and is provided with potting, the circuit board housing being configured to serve as a tub receptacle for the potting.

According to an embodiment, the potting is adapted to achieve IP-protection for the circuit board, at least complying with Class IP55, and preferably complying with at least Class IP68.

According to an embodiment, the circuit board has a longitudinal dimension with a first long side and a second long side, across therefrom, the potting having, adjacent the first long side, a first thickness D1, and, adjacent the second long side, a second thickness D2, the thicknesses D1 and D2 differing by at most 20%.

According to an embodiment, the antenna arrangement has an electrical fan unit cable which is electrically connected to the circuit board and extends through an opening in the fan unit housing to the exterior of the fan unit housing, in order to enable electrical connection of the circuit board to the outside.

According to an embodiment, the fan unit cable is guided along two mutually opposing fan unit housing sidewalls, in order to minimize the possibility of movement of the fan unit cable within the fan unit housing.

According to an embodiment, one fan unit housing face serves as a bottom face and at least two neighboring fan unit housing side faces serve as sidewalls and define a common corner edge of the fan unit housing. Two neighboring sidewalls define, adjacent the common corner, a gap, in order to hinder contact of the sidewalls in the region of the corner.

According to an embodiment, the fan unit housing has four sidewalls, each of which is connected to the bottom face. Each two adjacent sidewalls, of the four sidewalls, define a common corner of the fan unit housing. Each two neighboring sidewalls define a gap in the region of the corner, in order to hinder contact between the sidewalls in the region of the corner.

According to an embodiment, the sidewalls and the bottom face are formed from a single metal sheet, there being transition zones between the sidewalls and the bottom face, a bend in the metal sheet being carried out at each transition zone.

According to an embodiment, at least a first one of the sidewalls has, on a side remote from the bottom face, a wing region which is so angled over from the first sidewall that the wing region and the bottom surface define a space within the fan unit housing which is limited on two opposing sides.

According to an embodiment, the gap between two neighboring sidewalls is, at least partially, and preferably over the entire length of the gap, wider than 0.2 mm, preferably wider than 0.3 mm, and still more preferably wider than 0.5 mm.

According to an embodiment, the gap between two neighboring sidewalls is narrower than 3.0 mm, and preferably narrower than 2.0 mm.

According to an embodiment, the fan unit housing has a cover which is connectable to the sidewalls in such a way that it is on a side opposing the bottom face.

According to an embodiment, the cover is detachably connected to the sidewalls.

According to an embodiment, the cover has at least one stand-off element adapted to limit movement of two neighboring sidewalls with respect to each other, and to thereby hinder any contact between the sidewalls in the region of the gap. The stand-off element preferably engages against both neighboring sidewalls.

According to an embodiment, the cover is composed of a plastic, particularly of a glass-fiber-reinforced plastic.

According to an embodiment, the cover is configured as a shell. An inner region of the shell features an elevation with respect to at least a portion of the outer rim of the shell. The elevation features a flank. The elevation is preferably extending toward the exterior of the fan unit housing.

According to an embodiment, the flank is shaped with a curved contour, in order to obtain a stiffening of the shell.

According to an embodiment, fluid passage openings are provided in the region of the flank.

According to an embodiment, the inner region is formed with fluid passage openings for a plurality of fans.

According to an embodiment, in the inner region, a plateau is formed, and fluid passage openings for a plurality of fans is formed in the region of the plateau.

According to an embodiment, each of the fans secured in the fan unit housing has a rotor pot with a rotor pot floor and a rotor pot sidewall, and the fan unit housing is so arranged, in the antenna arrangement housing, that the rotor pot sidewall is located on the side of the rotor pot floor which is adjacent the antenna.

According to an embodiment, the at least two fans each have a fan housing. The fan housings are each connected via a fan housing connecting element to the fan unit housing side face.

The fan housing connecting element is composed of plastic.

According to an embodiment, the fan housing connecting element is formed as a spreading rivet. Preferably, it is inserted from the exterior of the fan unit housing, through a cutout of the fan unit housing, into a securing opening of the fan housing.

According to an embodiment, the fan cables of the fan are secured, using a cable securing element of plastic, on at least one fan unit housing side face, in order to minimize the possibility of movement of the fan cable within the fan unit housing.

According to an embodiment, the cable securing element has a cable binder and a detent element, coupled to the cable binder. The cable binder encircles the fan cable, and the detent element clips into a cutout in the fan housing.

According to an embodiment, at least the antenna-facing fan unit side face is formed of a metallic material, in order to provide shielding against whatever electromagnetic radiation is generated in the fan unit. The metallic material is preferably at least 60% by weight aluminum. Preferably, those fan unit housing side faces which are adjacent the antenna-facing side face are also composed of a metallic material.

According to an embodiment, the metallic material of the fan unit housing on the inside has no direct contact to a metallic material of a component arranged within the fan unit housing.

According to an embodiment, the fans feature a rotor pot, with a rotor pot floor, and a fan circuit board with electronic components. The fan circuit board is arranged in the rotor pot, so that the fan circuit board is shielded by the rotor pot.

According to an embodiment, the second fan unit housing side face is arranged opposing the first fan unit side face.

According to an embodiment, the antenna arrangement is mounted on a transmitting mast.

According to an embodiment, the antenna arrangement is installed as part of a base station.

The above-described embodiments can be combined with each other, unless stated otherwise.

Further details and advantageous refinements of the invention will be apparent from the exemplary embodiments described below and depicted in the drawings, which are not to be understood as limitations of the invention, and from the dependent claims. Shown are:

In the following drawings, equivalent or equivalently operating parts are designated with the same reference numerals and are each only described once. Expressions such as top, bottom left, right refer to the respective orientation of the drawing figure, insofar as nothing different is stated.

Figure 1:
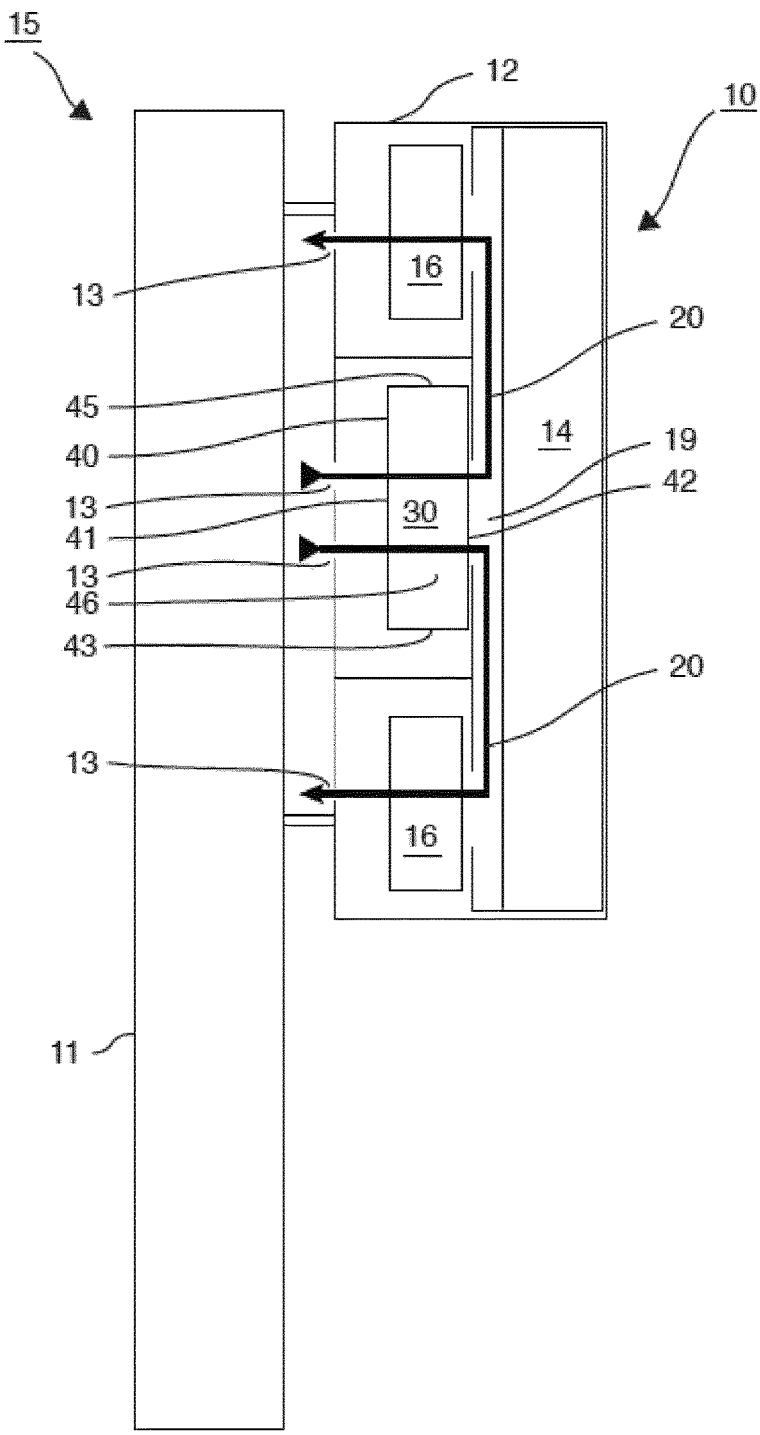
FIG. 1 is a schematic illustration of an antenna arrangement with a first embodiment of a fan unit.

FIG. 1 shows, in schematic representation, a base station 15 with an antenna arrangement 10, which is arranged on a carrier device 11, for example on an antenna mast 11.

Such antenna arrangements 10 are preferred and, as shown in
FIG. 1, are used in a base station (in English: base station or base transceiver station), for example in the base station 15 of a mobile telephone system, especially one according to the GSM standard, the LTE standard or the UMTS standard. A base station is a stationary transmission apparatus for radio signals of mobile radio networks, of cordless phones and of wireless networks. The antenna arrangement 10 can also, for example, be installed as an antenna arrangement on a ship.

The antenna arrangement 10 has a housing 12, which can also be called an "antenna arrangement housing." In the antenna arrangement housing 12 are an antenna 14, antenna electronics 16 for driving antenna 14 and a fan unit 30 for active cooling of the antenna electronics 16.

In the present embodiment, at each of two places, there are antenna electronics 16 provided. The antenna electronics 16 are also called the "signal amplifier" and they can be configured for transmitting, for receiving, and for sending and receiving.

The fan unit 30 has a housing 40 which, to distinguish it from the antenna arrangement housing 12, can be called a "fan unit housing 40." Housing 40 has a plurality of housing side surfaces, of which the housing side surfaces 41, 42, 43, 45, and 46 have been given reference numbers. The housing side surfaces can also be called "fan unit housing side faces." Fan unit 30 is adapted to convey a fluid from the first housing side surface 41, which in this embodiment is arranged on the side of housing 40 oriented away from antenna 14, to a second housing side surface 42, which in this embodiment is arranged on the side of housing 40 which is oriented toward antenna 14.

A fluid channel 19 is provided in housing 12 and by means of the fan unit 30, the fluid from housing side surface 42 is fed via the fluid channel 19 to antenna electronics 16, in order to actively cool antenna electronics 16. The fluid stream is schematically illustrated by an arrow 20. By "fluid," one is preferably referring to air but, depending upon the installation, it can also refer to a different gas.

Preferably, in the antenna arrangement housing 12, openings are provided to permit cooling with ambient air (or generally using a fluid). It is, however, also possible to have a closed circulation loop.

Figure 2:
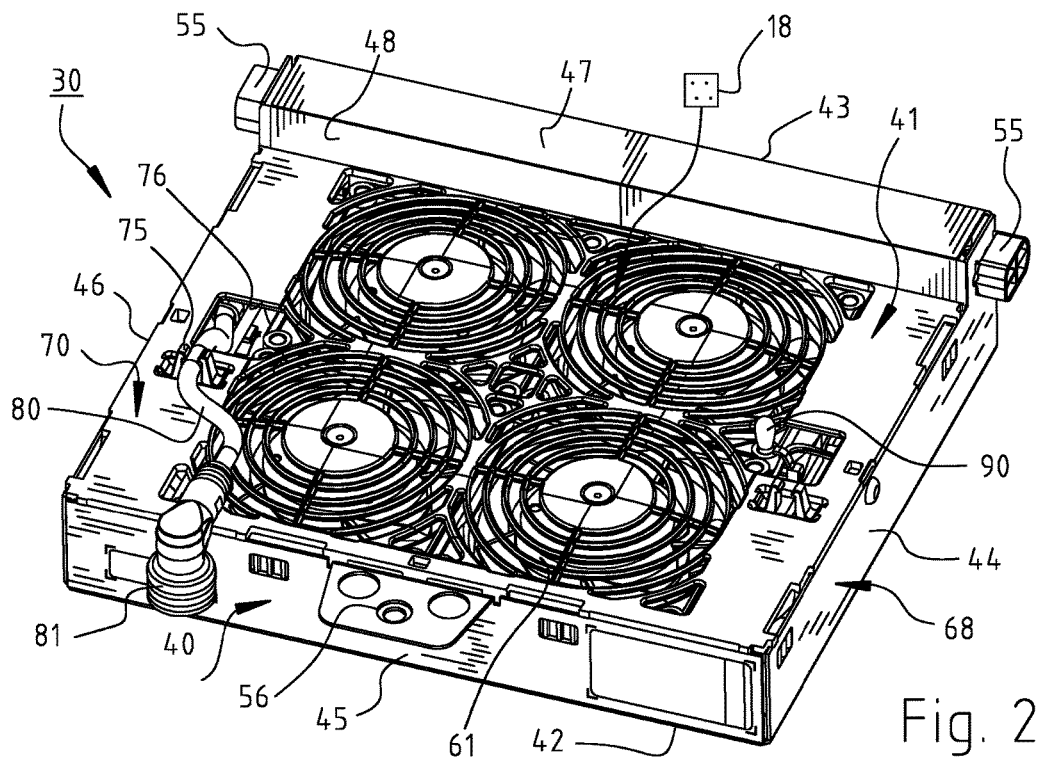
FIG. 2 is a perspective view of the front side of the fan unit of FIG. 1.

FIG. 2 shows fan unit 30 with housing 40. Besides the housing side surfaces 41, 42, 43, 45, 46 shown in FIG. 1, housing side faces 44, 47 and 48 are also designated with reference numerals. With reference to the exemplary embodiment shown in FIG. 1 of installation of fan unit 30 in the antenna arrangement 10, one can designate housing side surfaces 41, 47 as front surfaces, housing side surface 42 as the back surface, housing side surfaces 45, 48 as the top side, the housing side surfaces 43 as the bottom side, housing side surface 46 as the right side and housing side surface 44 as the left side.

On housing side surface 44, a projection 55 is provided, and on housing side surface 46, another projection 55 is similarly provided.

On housing side surface 45, a fastening element 56 is provided. The fan unit can, for example, be secured in an antenna arrangement housing 12. The projections 55 can engage in a guide (not shown) in the antenna arrangement housing 12 and be subsequently tipped far enough that the fastening element 56 can be secured to a fastening member (not shown) in the antenna arrangement housing, e.g. using a plastic screw.

Figure 3:
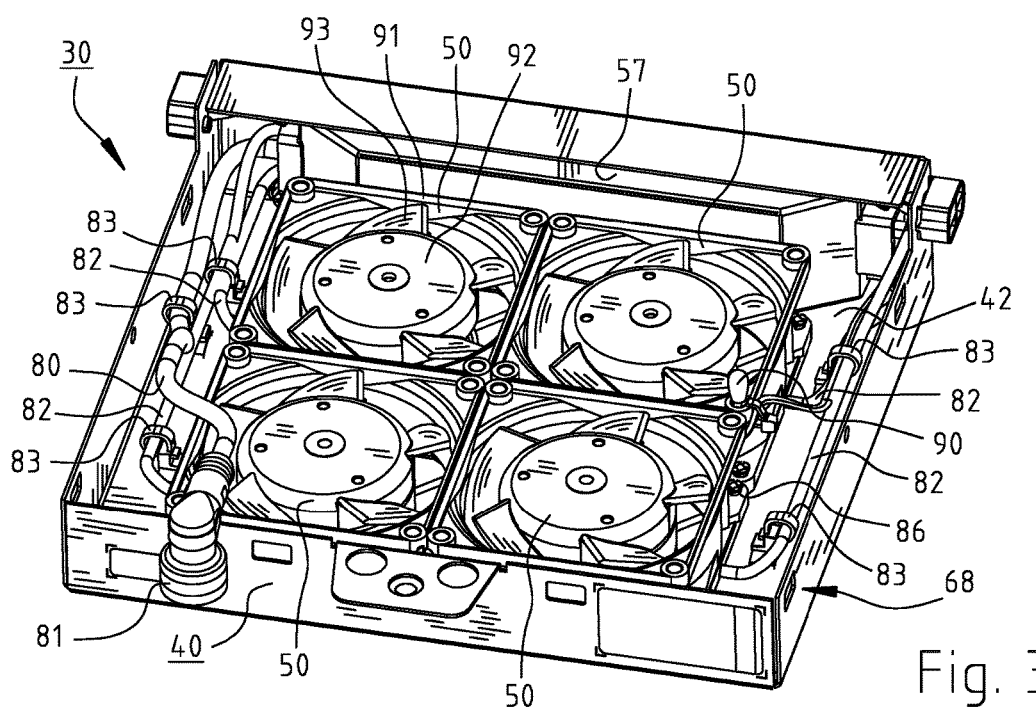
FIG. 3 is a perspective view, corresponding to FIG. 2, of the front side of the fan unit of FIG. 2, without cover.

On housing side surface 41, preferably a cover 70 of housing 40 is provided. Fluid passage openings 61 for the fans of the fan unit 30 are provided. In the present preferred embodiment, four fans are provided, as shown in FIG. 3.

A fluid is schematically indicated at 18. This is drawn in or taken in, by the fan unit 30, at housing side surface 41, and exhausted or blown out at housing side surface 42.

Preferably, cover 70 is secured to a housing base portion 68. Configuring cover 70 as a finger-protection grill is advantageous, to minimize risk of serious injury to fingers during assembly or disassembly of the fan unit 30.

Preferably, a fan-unit cable 80 is provided for electrical connection of fan unit 30, and this fan-unit cable 80 preferably extends through an opening 76 in cover 70 and runs through housing 40 to the outside. Fan-unit cable 80, on the outer side of fan housing 40, is preferably fed through a guide 75, in order to limit motion of fan-unit cable 80. Preferably, at an end of fan-unit cable 80, a shielded plug 81 is provided.

The fan unit 30 preferably includes a temperature sensor 90 to ascertain the temperature of the fluid 18, for example to enable adjustment of the fan speed according to the ambient temperature.

FIG. 3 shows fan unit 30 without the cover 70 from FIG. 2, so that the interior of the fan unit 30, within housing base portion 68, is visible.

Within housing 40, a plurality of fans 50 are arranged; in the exemplary embodiment, there are four. Depending upon the application, one could provide, for example, two, three, five or six fans. Fans 50 are respectively electrically connected via a fan cable 82. Fans 50 preferably each have a fan housing 91 with securing openings 94 and preferably a fan wheel 92 with fan blades 93. In the exemplary embodiment, fan housing 91 has an air channel whose diameter is about 76 mm.

In housing 40, a controller 57 is preferably provided, which is configured to drive the fans 50. For this purpose, the fan cables 82 are connected to controller 57. The fan-unit cable 80 is likewise connected to controller 57, in order to supply the controller with current and also to enable transmission of data from the fan unit 30 to the outside and/or from the outside to fan unit 30.

The fan cables 82 of the fans 50 are preferably secured by cable clip elements 83 on at least one of the housing side surfaces 42, in order to minimize the possibility of movement of the fan cables 82 within housing 40. Preferably, the cable clip elements 83 are composed of a plastic, in order to avoid any unplanned contact between two metals, and to work against any passive intermodulation. Tests have shown that freely movable leads in the fan unit can lead to negative influences.

Controller 57 specifies a rotation speed to the fans 50, for example via a rotation speed target value applied to a rotation speed control associated with the fans, or by adjustment of a control voltage fed to the fans 50. The rotation speed target value or the control voltage is preferably specified as a function of the temperature reported by the temperature sensor 90.

Preferably, controller 57 also monitors the fans 50 so that, for example, if one fan stops running, the speed of the remaining fans is increased.

Figure 4:
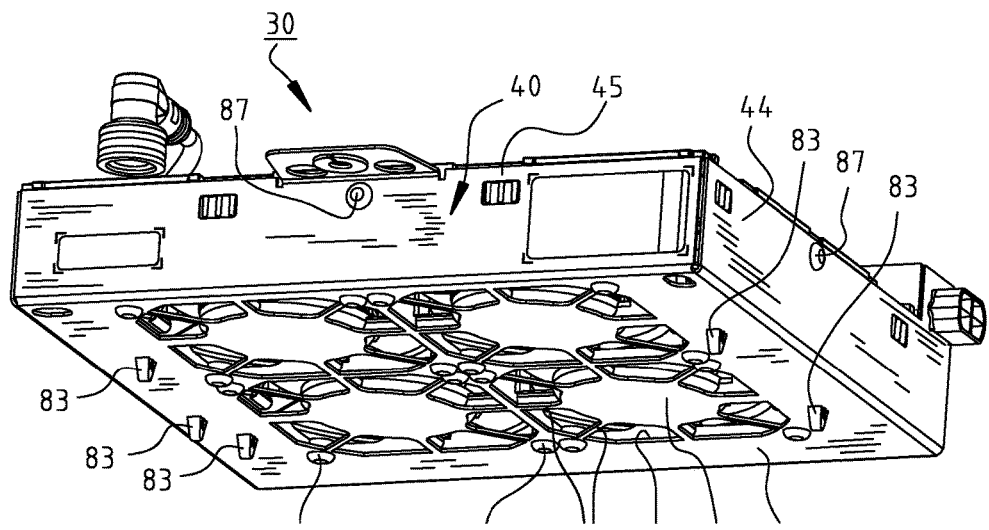
FIG. 4 is a perspective view of the back side of the fan unit of FIG. 2.

FIG. 4 shows the housing side face 42 of housing 40 of fan unit 30. After assembly, housing side face 42 is oriented toward antenna 14 and, in order to reduce possible electromagnetic noise influences of fan unit 30 on antenna 30, housing side face 42 is preferably composed of a metallic material, i.e. of a metal or a metal alloy. Thus, a shielding of the antenna 14 is achieved.

As the metallic material, preferably a material is chosen whose composition by mass is at least 0.60 aluminum. Preferably, the fan unit housing sides 43, 44, 45, 46, which border the antenna-facing housing side 42, also are formed of a metallic material. Tests have shown that aluminum is a good candidate to be the main component of this material, since it has not led to passive intermodulation. Stainless steel, by contrast, was revealed by the tests to be unsuitable.

Since, in the embodiment of FIG. 1, the fluid is exhausted at housing face 42, fluid passage openings 62 for the fans (compare FIG. 3) are provided.

The cable clip elements 82 (compare FIG. 3) extend upward on housing face 42.

Figure 5:
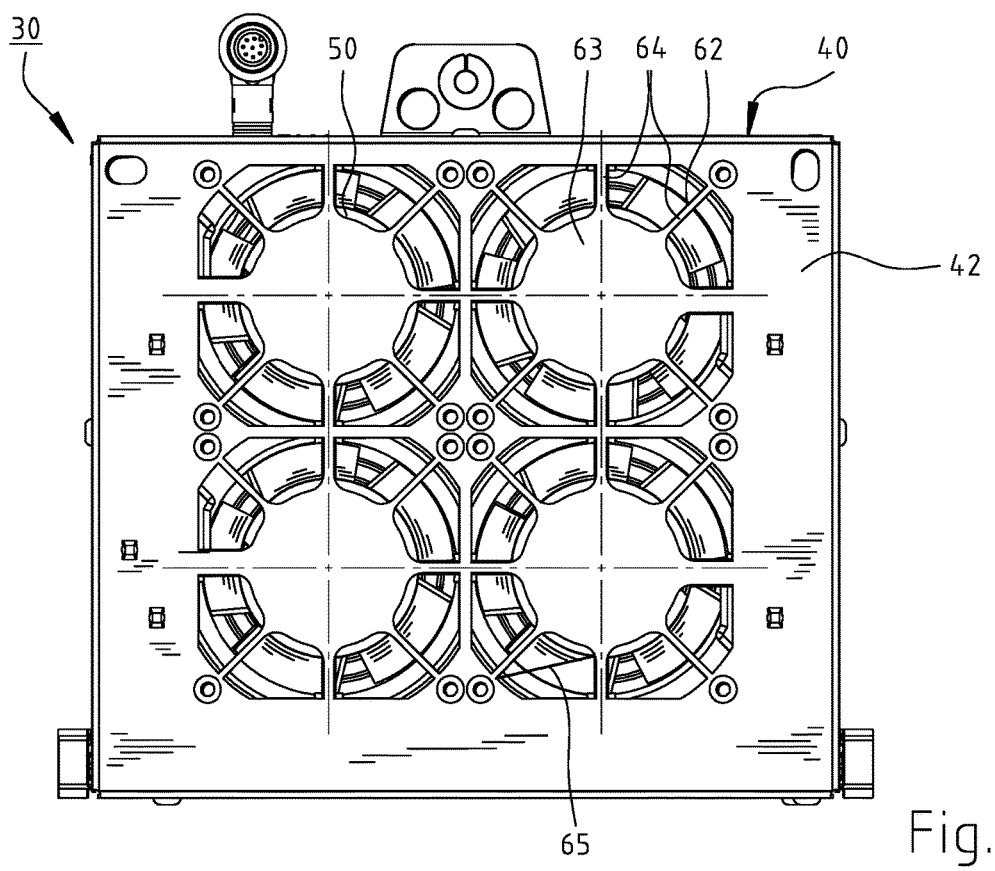
FIG. 5 is a plan view of the back side of the fan unit of FIG. 2.

FIG. 5 shows the housing side face 42 of fan unit 30. Housing side face 42 of housing 40 has, for each fan 50, an annular fluid passage opening 62 with a region 63 (central with reference to the associated fan 50) which is so configured as to screen against electromagnetic radiation emanating from the fans 50 or their electronics. For this purpose, struts or bridges 64 are provided which mechanically connect the central region 63 with the remaining portion of the housing side face 42. The maximum width of the fluid passage openings 62 is designated with reference numeral 65 and the maximum width of a cutout on housing side face 42, oriented toward antenna 14, is preferably smaller than 5.0 cm, and more preferably smaller than 3.0 cm, in order to effectively screen against electromagnetic radiation. In order to limit this maximum width, one can, depending upon the size of fans 50, provide additional struts 64. In the present example, each central region 63 is connected via eight struts 64 with the outer portion of housing side face 42.

Figure 6:
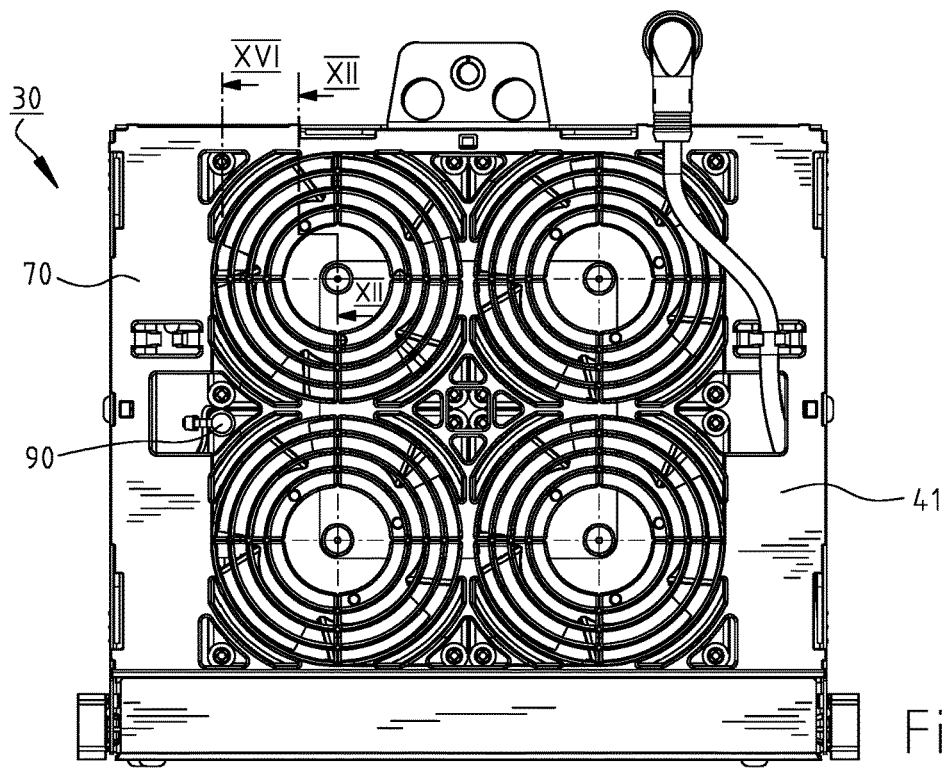
FIG. 6 is a plan view of the front side of the fan unit of FIG. 2.

FIG. 6 illustrates housing face 41 of fan unit 30 with a mounted cover 70. Cross-section lines XII-XII and XVI-XVI are indicated.

Figure 7:
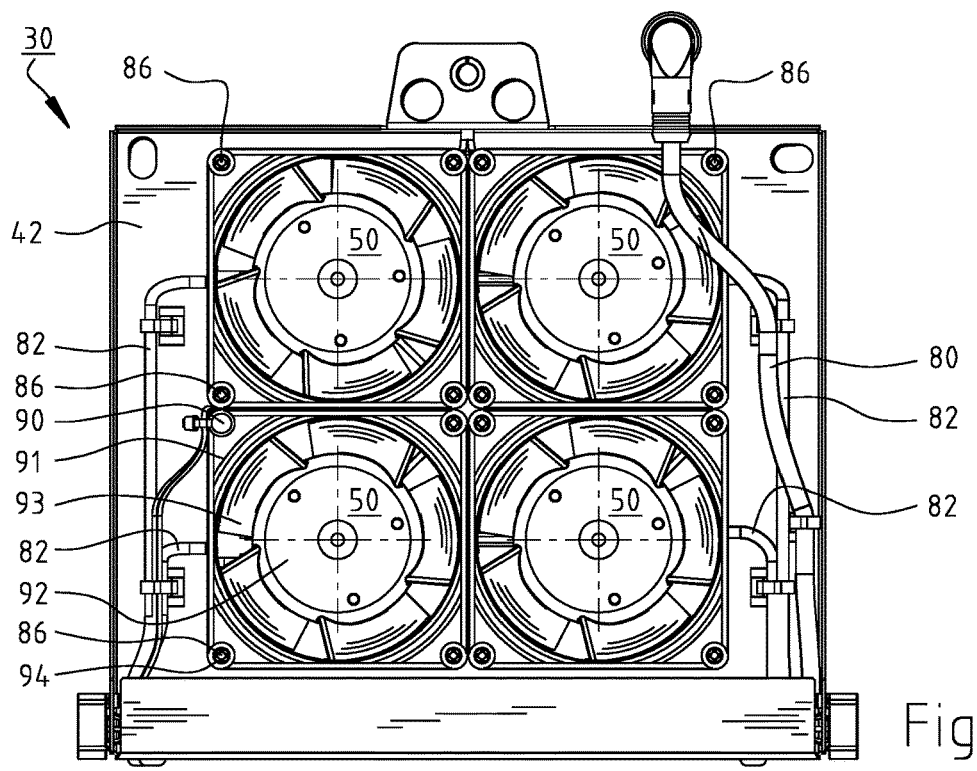
FIG. 7 is a plan view of the front side of the fan unit of FIG. 2, without cover.

FIG. 7 is a view corresponding to FIG. 6, but omitting cover 70.

In the view chosen, one sees that, in the securing openings 94 of the fan housing 91, fan housing connecting elements 86 are provided.

Thereby, the fan housings 91 are connected to housing side face 42.

Preferably, for securing temperature sensor 90, a securing opening 94 of one of the fans 50 is used; thereby, one can omit additional means for securing temperature sensor 90 in place.

Figure 8:
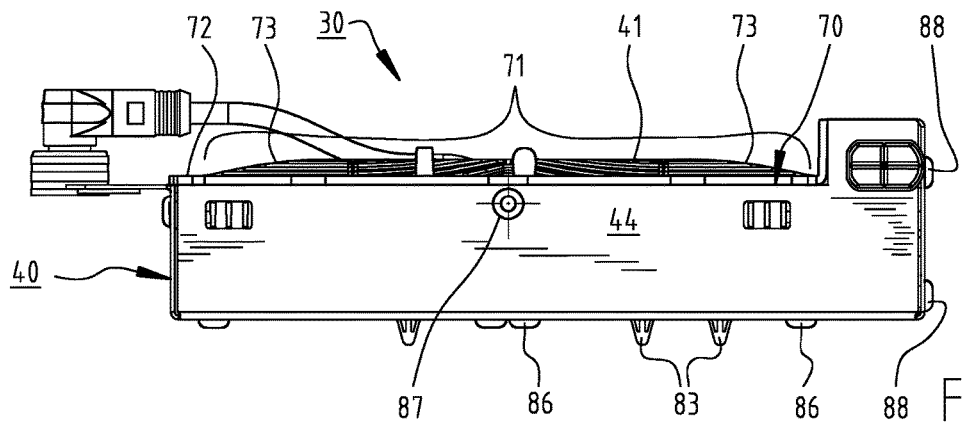
FIG. 8 is a plan view of the left side of the fan unit of FIG. 2.

FIG. 8 illustrates fan unit 30, looking at side face 44.

Configuration of the Cover as a Shell

Cover 70 is preferably configured as a shell, i.e. a generally flat element with curved surfaces. Cover 70 has an inner region 71 which is configured as raised with respect to at least a portion of an outer region 72 of cover 70. The transition from the outer rim 72 to the inner region 71 of cover 70 is preferably shaped as a flank 72 and the elevation of the inner region 71 is preferably toward the outer side of housing 40.

By configuring cover 70 as a shell, a stiffening of the cover is achieved and this permits, for example, forming the cover 70 from plastic.

Preferably, the flank 73 is formed with a curved contour, as may be seen in FIG. 8. This permits a very stable and well-stiffened cover 70.

Preferably, adjacent the flank 73, fluid passage openings 61 are provided. This makes possible a large surface for the fluid passage openings 61. Preferably, the inner region 71 has fluid passage openings 61 for a plurality of fans 50. The elevation of the inner region 71 thus extends across a plurality of fans, and this results in a contour of cover 70 which is both conducive to manufacturing and, at the same time, stable.

Preferably, in the inner region 71, fluid passage openings 61 for a plurality of fans 50 are formed, and this makes possible a space-saving arrangement. Particularly preferred is forming the inner region as a plateau; in spite of the stability achieved by formation as a shell, a space-saving arrangement is obtained, since the height of the shell can be kept small.

Figure 9:
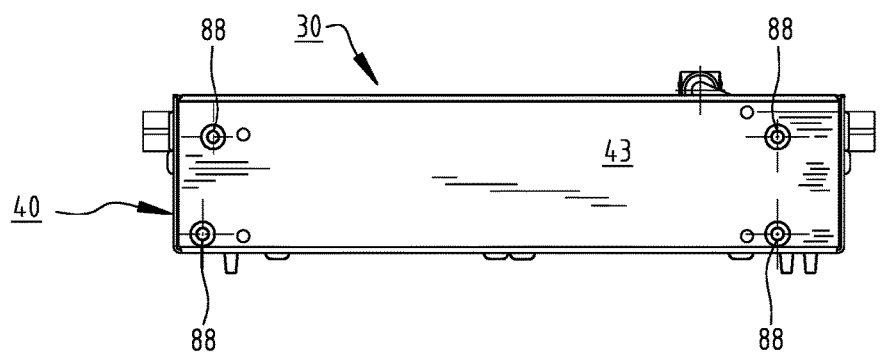
FIG. 9 is a plan view of the bottom side of the fan unit of FIG. 2.

FIG. 9 shows the fan unit from the viewpoint of housing side face 43. A plurality of control device fastening elements 88 are provided,
in order to fasten the control device 57 (see FIG. 3) onto housing 40.

Figure 10:
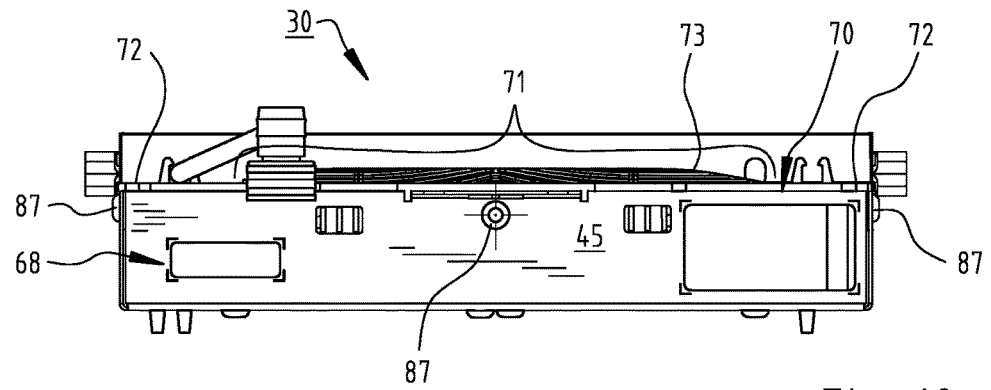
FIG. 10 is a plan view of the top side of the fan unit of FIG. 2.

FIG. 10 shows the fan unit 30 from the viewpoint of housing side face 45. Using cover-fastening elements 87, cover 70 is secured onto housing base part 68. The cover-fastening elements 87 are preferably formed as spreading-rivets.

Figure 11:
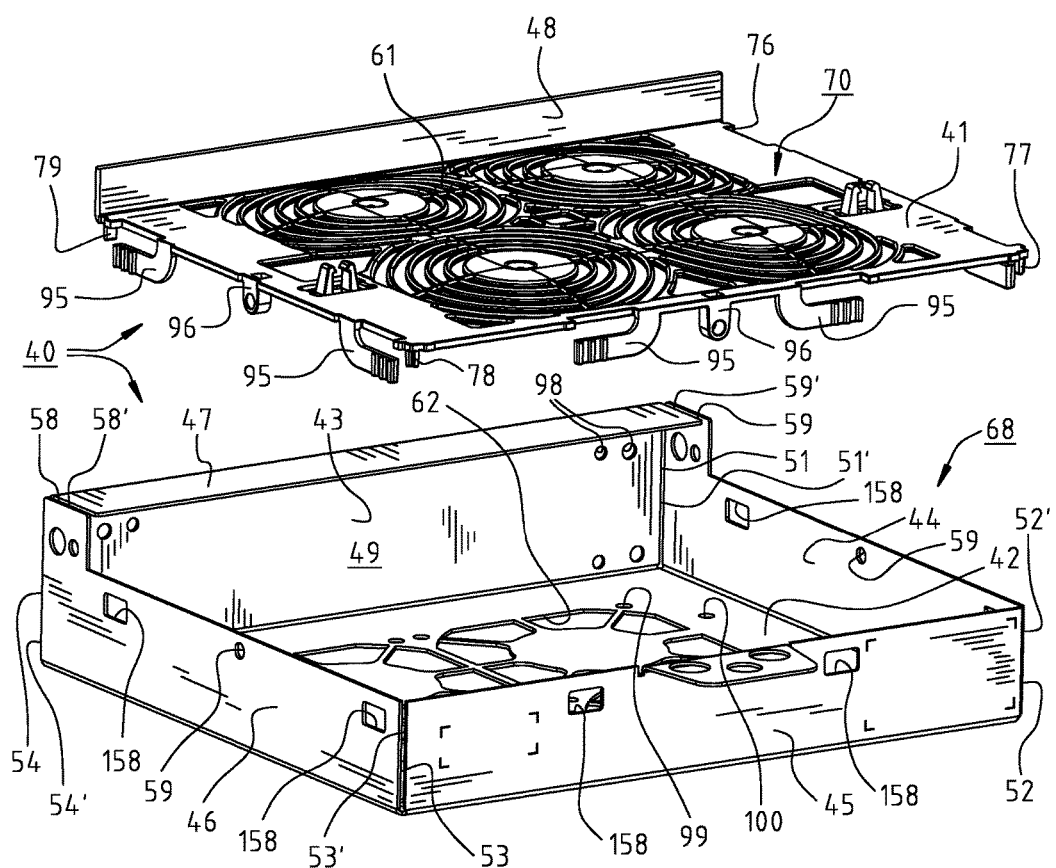
FIG. 11 is a perspective exploded view of the housing of the fan unit of FIG. 2.

FIG. 11 shows the empty housing 40 with the housing base part 68 and the cover 70, which is connectable to the housing base part 68.

Housing base part 68 preferably has a housing side face 42, serving as a bottom face, and housing side faces 45, 46 which serve as side faces; these side faces are each connected to the bottom face and form a common corner 53 of housing 40. The two contiguous sidewalls 45, 46 define, in the region of corner 53, a gap 53', in order to minimize contact between sidewalls 45 and 46 in the region of corner 53. Such a configuration with a gap 53' has proven to be very advantageous, since thereby the danger, of passive intermodulation due to not-well-defined contact between two metal pieces, is drastically reduced.

In the same manner, the housing side faces 44 and 43 are formed as sidewalls, each respectively connected with the bottom face 42. The sidewalls 43 and 44 form a corner 51 with a gap 51'; the sidewalls 44 and 45 form a corner 52 with a gap 52'; and the sidewalls 46 and 43 form a corner 54 with a gap 54'. The four sidewalls 43, 44, 45, 46 are thus connected to bottom face 42.

Preferably, sidewalls 43, 44, 45, 46 and the bottom face 42 are formed from a sheet of metal. In the transition zones between the sidewalls 43, 44, 45, 46 and the bottom face 42, a bend is made in the metal sheet, in order to configure the sidewalls with respect to bottom face 42. Such bending has been found not to make any critical difference when considering passive intermodulation.

Preferably, sidewall 43 has, on its side remote from the bottom side 42, a wing region 47, which is angled over from sidewall 43 in such a way that wing region 47 and bottom face 42 together define a space 49 within housing 40, and limit that space on two opposing sides. Thus, a space 49, within housing 40, is defined, which is formed by sidewalls 43, 44 and 46, as well as by the bottom face 42 and the wing region 47, surrounded on five sides by housing 40; side face 45, in a broad sense, also surrounds space 49. On one hand, this mechanically protects space 49; on the other hand, given a preferred metal composition of housing base part 68, a good shielding, of any electronic components arranged in space 49, is made possible. Particularly preferred is the placement of control device 57 in space 49 (cf. FIG. 3). Wing region 47 forms a roof for space 49, and thereby reflection of electromagnetic waves is minimized.

Preferably, respective corner edges 59 and 58 are formed between wing region 47 and the contiguous side faces 44 and 46, and in the region of corners 59 and 58 are defined respective gaps 59' and 58', in order to hinder contact of wing region 47 with the sidewalls 44 or 46.

The gaps 51', 52', 53', 54' between the neighboring sidewalls 43 and 44 or 44 and 45 or 45 and 46 or 45 and 43 is, at least partway along and preferably over the entire length of the respective gaps 51', 52', 53', 54', wider than 0.2 mm, preferably wider than 0.3 mm, still more preferably wider than 0.5 mm. In this way, contact between the side surfaces 44, 45, 46, 43 in the area of gaps 51', 52', 53', 54' can be reliably avoided, even considering material expansion due to temperature changes, and even considering rattling or shock loading of the antenna arrangement 10, for example in a storm.

Preferably, the gaps 51', 52', 53', 54' are smaller than 2.0 mm, in order to improve the shielding of electromagnetic radiation provided by housing base part 68.

The gaps 59', 58' between the wing region 47 and the sidewalls 44 or 46 are, at least partway, and preferably over the entire length, wider than 0.2 mm, preferably wider than 0.3 mm, still more preferably wider than 0.5 mm, in order to hinder contact between the neighboring housing side faces. Preferably, the gaps are narrower than 3.0 mm. The danger of emission of electromagnetic radiation is less critical in the area of gaps 59', 58', since these are located on the side remote from antenna 14.

In housing base part 68 are cutouts 98 for securing of control device 57 using a control device securing element 88 (cf. FIG. 9), cutouts 99 for securing of fans 50 using fan-housing connecting element 86, and cutouts 100 for securing cable securing elements 83 (cf. FIG. 3).

Preferably, the cutouts 98, 99, 100, 62 in housing base part 68 are made by stamping, the stamping being accomplished from the side which in housing part 68 is the exterior. In this manner, the stamping burrs are on the interior of housing 40, and thus the danger of them having a negative influence, due to passive intermodulation, is less than it would be, if the burrs were on the exterior.

Cover of Housing 40

Cover 70 has a housing-side face 41 and an angled-over housing side face 48, which closes off housing 40 with wing region 47 in an elevated zone.

On cover 70, sideways-flexing detent elements 95 are provided, which are so shaped that they springily engage into corresponding cutouts 158 in housing base part 68, and thus define a predetermined position of cover 70 relative housing base part 68.

Preferably, on the sides of cover 70, cover securing elements 96 are provided which, after the mounting of cover 70, are so oriented with respect to the cutouts 59 in housing base part 68, that securing of cover 70 can be achieved in this position, such as by use of the cover securing elements 87, which are shown in FIGS. 8 and 10.

On cover 70, preferably several stand-off elements 76, 77, 78, 79 are provided, which are intended to hinder motion of the neighboring sidewalls 43, 44 or 44, 45 or 45, 45 or 46, 43 with respect to each other. For this purpose, the stand-off elements preferably engaged again the two neighboring sidewalls, preferably on the inside of housing 40. This further diminishes the risk of contact among the sidewalls in the region of gaps 51', 52', 53', 54'.

Cover 70 is preferably composed of plastic. On one hand, this forecloses the possibility, during fastening of the cover, that contact between two metallic workpieces might occur, and, on the other hand, cover 70 is preferably arranged on the side remote from antenna 14, so that the risk of disturbances from electromagnetic waves is lower in this region. Further, in the region of cover 70, electromagnetic radiation emitted, due to any electromagnetic circuitry located around the fans 50, will tend to be shielded by fanwheels 92 (cf. FIG. 3), since these usually have a rotor pot composed of metal.

It is particularly preferred to form cover 70 from a glass-fiber-reinforced plastic. On one hand, glass-fiber-reinforced plastic has high stability and, on the other hand, glass-fiber-reinforced plastic has no negative consequences for antenna 14. Experiments have shown that carbon-fiber-reinforced plastic is less suitable, since it can lead to interactions with antenna 14.

Figure 12:
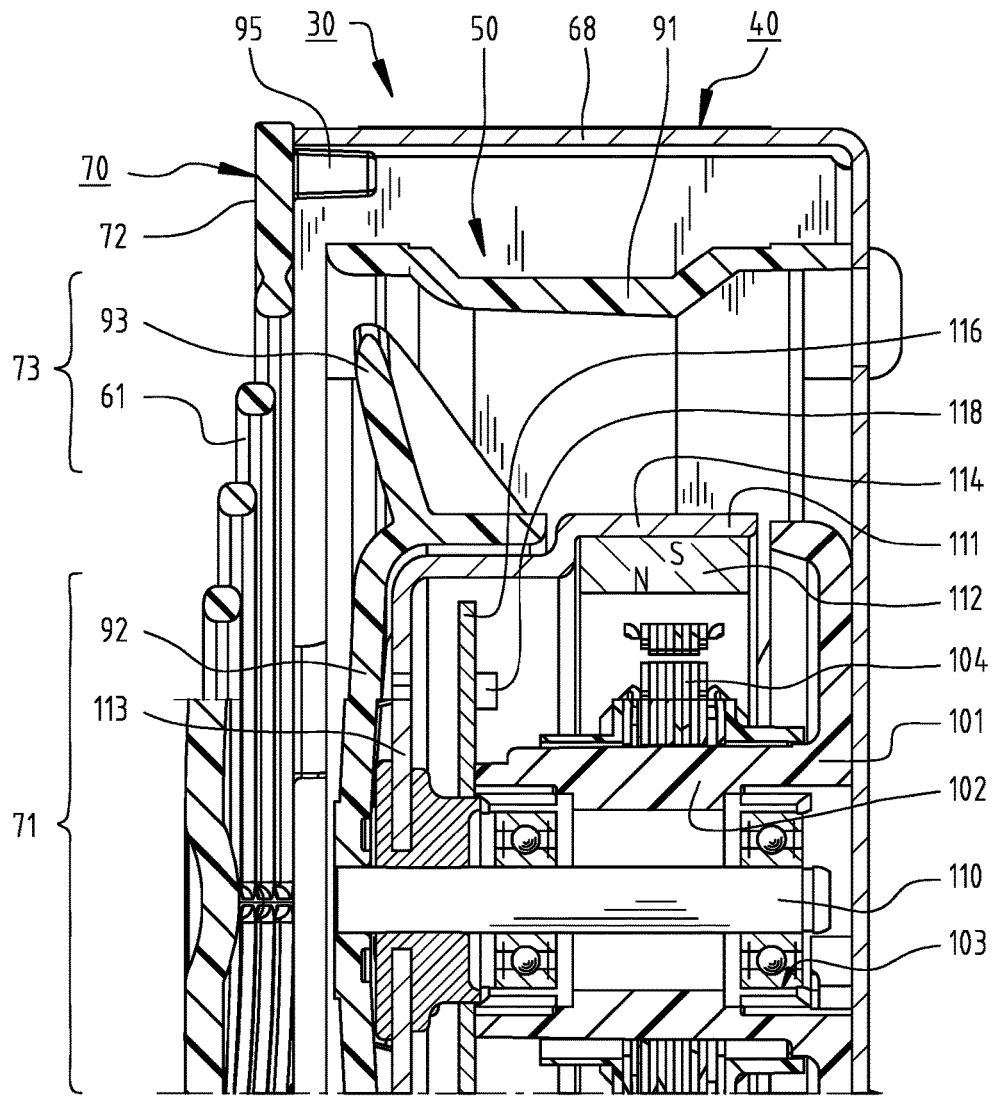
FIG. 12 is a section along line XII-XII of FIG. 6.

FIG. 12 is a longitudinal section through one of the fans 50 which are mounted in housing 40. Fan 50 has a flange 101 which is connected with fan housing 91 via struts, not shown. On flange 101, a bearing tube 102 is arranged, and therein a bearing arrangement 103 for journaling of a shaft 110 is provided. A stator 104 is mounted on the bearing tube 102. Shaft 110 is coupled to a rotor pot 111; in the rotor pot 111, a permanent magnet 112 is arranged, in order to work together with stator 104, and thus to set the fanwheel 92 and its fan blades 93 into motion. Since the rotor pot 11 is generally formed of metal, it serves as a shield with respect to cover 70.

Rotor pot 11 has a rotor pot floor 113 and a rotor pot sidewall 114, and housing 40 is so arranged in antenna arrangement housing 12 that the rotor pot sidewall 114 is arranged on the side of rotor pot floor 113 adjacent to antenna 14. In this way, emission of electromagnetic waves in the direction of antenna 14 are greatly damped, and a plastic cover 70 can be employed.

In cover 70, one can see the outer rim 72, the flank 73 and the elevated inner region 71; cover 70 preferably has a spacing from fan housing 91 and from fan wheel 92.

In particular, fan 50 has a fan circuit board 116 with an electronic component 118; the fan circuit board 116 is arranged in the rotor pot 114, particularly preferably between stator 104 and rotor pot floor 113. Thereby, the fan circuit board 116 is shielded by the rotor pot 114, i.e. the electromagnetic radiation is damped in the outer region. This was particularly advantageous because tests have shown that the materials used in electrical components (e.g. in microcontrollers) could lead to influence on the antenna 14.

Figure 13:
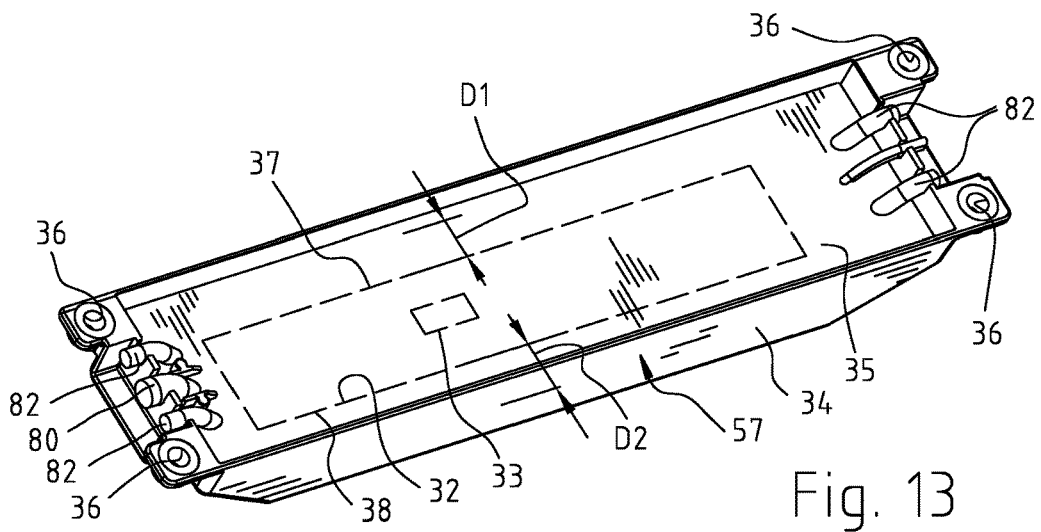
FIG. 13 is a perspective view of a controller of the fan unit of FIG. 2.

FIG. 13 illustrates the control device 57, which preferably is located in fan unit 30, as shown in FIG. 3. The control device 57 has a circuit board 32 with an electrical circuit or electrical components 33, and circuit board 32 is in a circuit board housing 34. Circuit board housing is preferably formed as a tub, in order to enable potting of circuit board 32 in tub 34. Fan unit cable 80 and the fan cable 82 are connected to circuit board 82, and circuit board 32 with electrical components 33 and the cables 80, 82 are preferably protected by potting from water and dust, so that circuit board 32 and the electrical components 33 fulfill the IP-protection standards of class IP-55 or better, and more preferably those of class IP-68 or better.

Such potting is preferably done with a plastic, e.g. polyurethane resin. One speaks generally of a PUR material, i.e. a polyurethane material. There are, however, also suitable thermoplastic meltable adhesives, e.g. based upon polyamides.

Circuit board 32 has a longitudinal dimension with a first long side 37 and a second long side 38, across from side 37. The potting 35 has, at first long side 37, a first thickness D1 and, at second long side 38, a second thickness D2, the first thickness and the second thickness differing by a maximum of 20%. Experiments have shown, that, using a relatively constant thickness of potting 37, negative influences arising from length changes associated with temperature changes are minimized, and this leads to a higher reliability of control device 57.

Along circuit board housing 34, holes 36 are provided, in order to facilitate coupling of control device 57 onto housing 40 with the aid of control device securing elements 88 (cf. FIG. 9). As the control device securing elements 88, one preferably uses spreading rivets of plastic, in order to eliminate a metal-to-metal contact.

Figure 14:
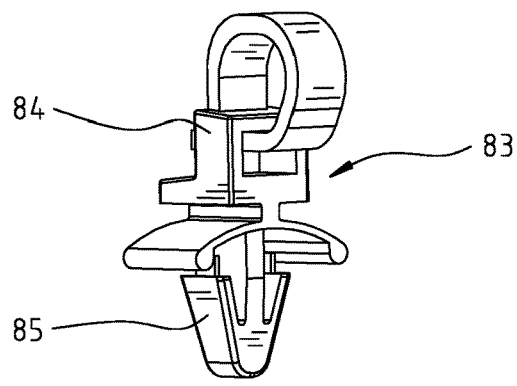
FIG. 14 is a cable-fastening element for the fan unit of FIG. 2.

FIG. 14 shows the cable securing element 83 with its cable binder 84 for reception of fan unit cable 80 or fan cable 82 (cf. FIG. 3) and with the detent element 85 which, upon shoving of cable securing element 83 into hole 100 (cf. FIG. 11), engages in housing 40 and thus secures cable 80 or 82 onto housing 40.

Figure 15:
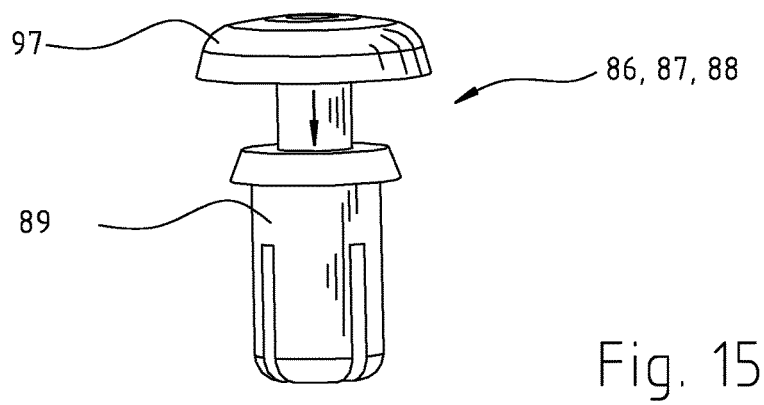
FIG. 15 shows an expanding rivet for the fan unit of FIG. 2.

FIG. 15 illustrates a suitable spreading rivet, which preferably is used as fan housing connecting element 86, as cover connecting element 87 and/or as control circuit connecting element 88 (cf. FIG. 8).

Spreading rivet 86, 87, 88 has a base portion 89 and a head portion 97. The base portion 89 is inserted into one of the recesses 59, 98, 99 and, by a displacement of head 97 with respect to base portion 89, a spreading of base portion 89 is achieved. The displacement of head portion 97 happens, for example, using a tool such as a press or a robotic arm.

Figure 16:
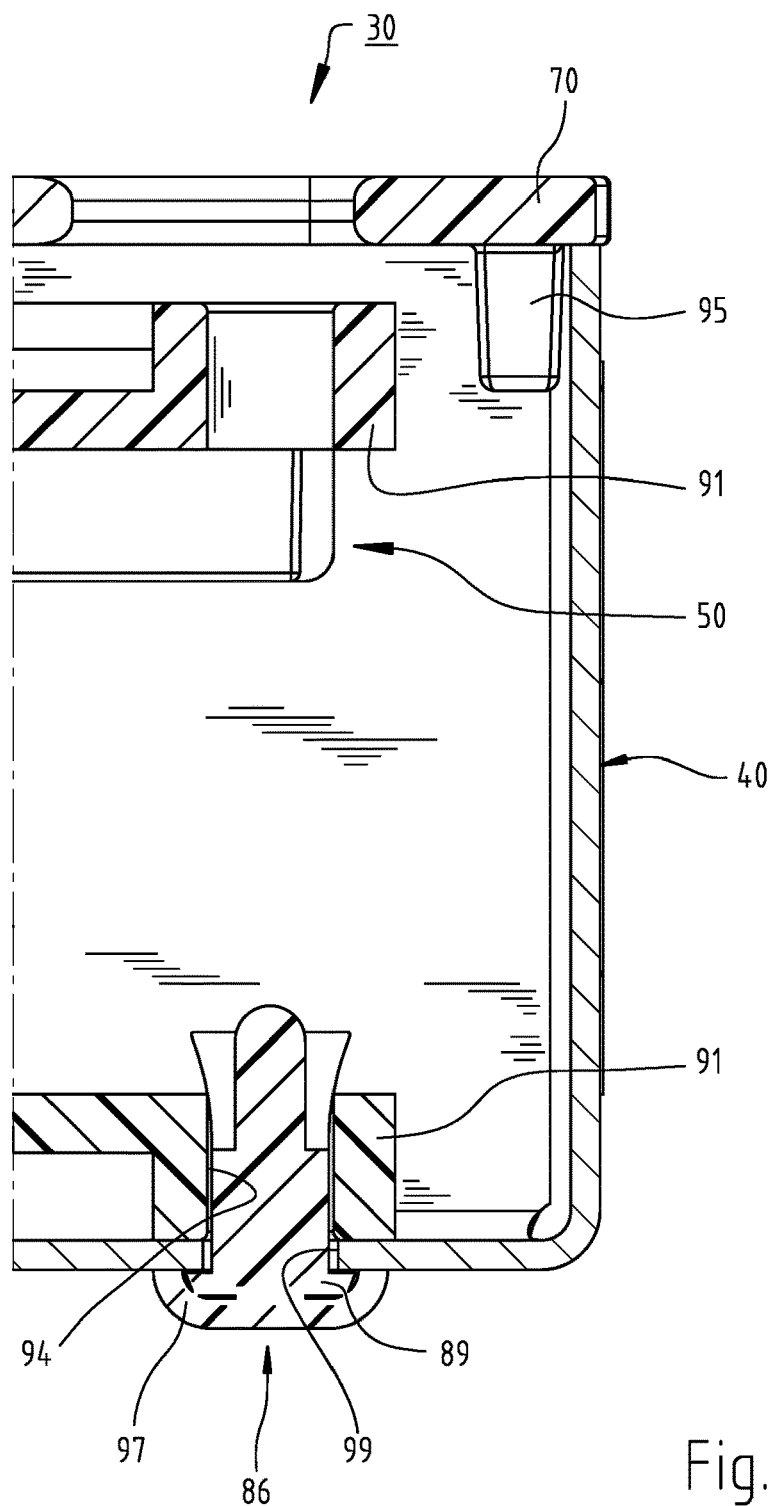
FIG. 16 is a sectional view along line XVI-XVI of FIG. 6.

FIG. 16 is a sectional view through fan unit 30, including a section through spreading rivet 86, which spreading rivet secures fan housing 91 onto housing 40. The base portion 89 of spreading rivet 86 extend through hole 99 in housing 40, and through securing opening 94 of the fan housing and, by the pressing in of head portion 97, rivet 96 is spread and thereby secures fan 50 to housing 40.

Figure 18:
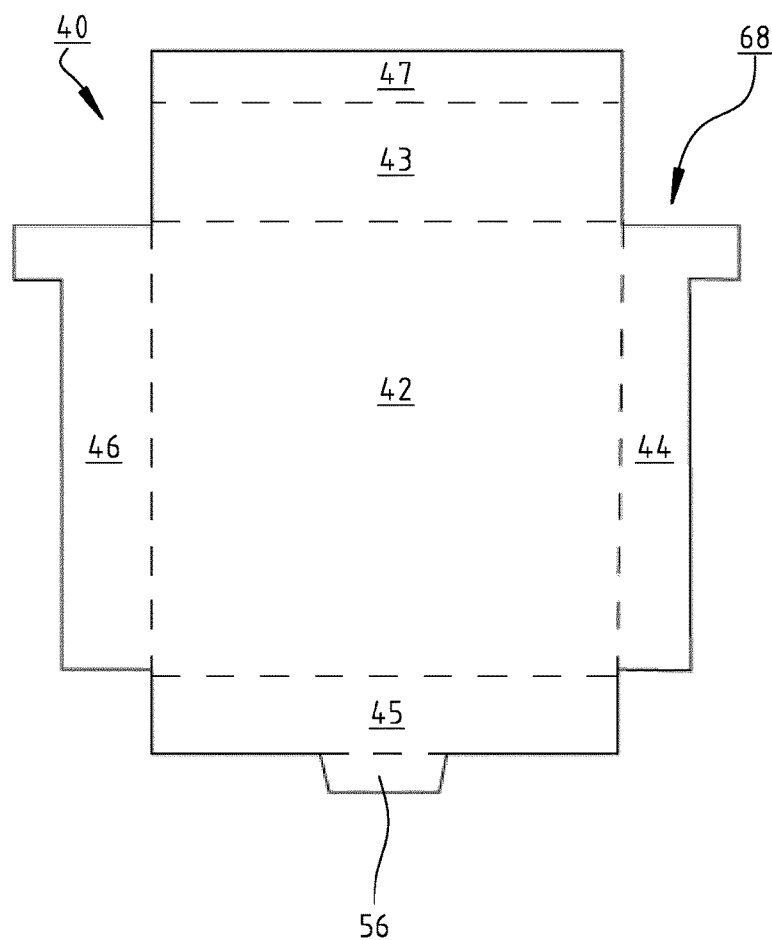
FIG. 18 is a flattened version, showing bend lines, of the fan housing of the fan unit of FIG. 2.

FIG. 18 is a schematic depiction of housing base portion 68 of fan housing 40. Base portion 69 is composed, for example, of sheet metal and, by bending of faces 43, 44, 45, 36, 37, 56 at the indicated bending locations, the entire housing base portion with its gaps can be created. The cutouts in housing base portion 69 are not depicted, but are preferably created by a stamping process applied to the exterior contour.

Figure 17:
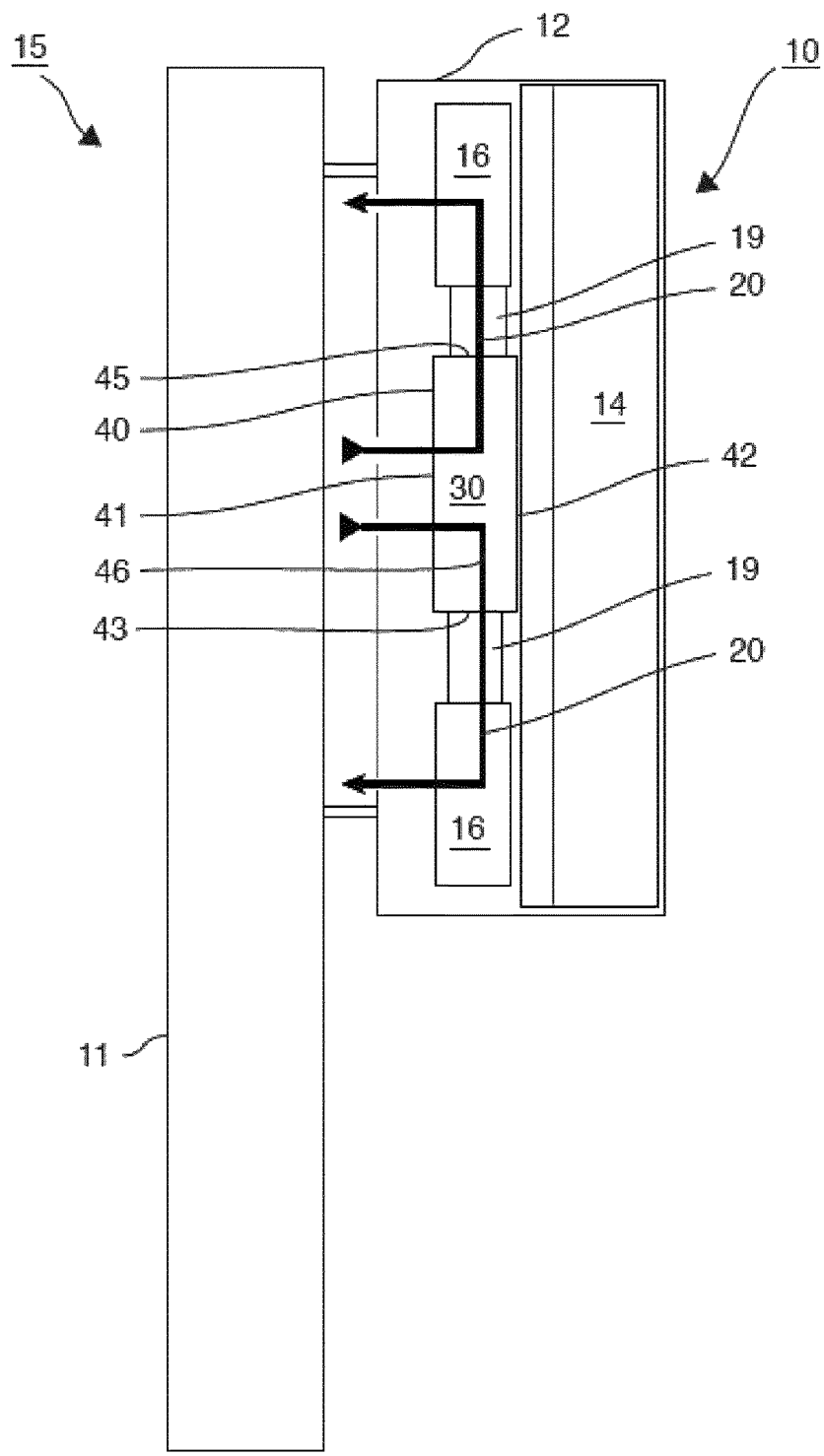
FIG. 17 is a schematic representation of an antenna arrangement with a second embodiment of a fan unit.

FIG. 17 shows a second embodiment of antenna arrangement 10, wherein one uses radial fans instead of axial fans. They draw the fluid axially in at housing side face 41 and blow radially out at at least one of housing side faces 43, 45. The at least one fluid intake channel 19 is adapted to the revised embodiment of fan 50, and guides the fluid from housing side faces 43, 45 onto antenna electronics 16.

With reference to fan unit 30, the housing side face 42 can be formed closed, since an air stream through this housing side face 42 is not completely necessary. Preferably, on housing side faces 43, 45, air passage openings 62 are provided. Cover 70 and the housing base portion 68 can otherwise remain as previously described.

Naturally, many variations and modifications are possible, within the scope of the present invention.

The invention claimed is:

1. An antenna arrangement (10) having an antenna arrangement housing (12) in which are arranged:
an antenna (14);
antenna electronics (16) for driving the antenna (14), and a fan unit (30) for active cooling of the antenna electronics (16);
wherein the fan unit (30) comprises a fan unit housing (40) having a plurality of fan unit housing side surfaces (41-47) including a first housing side surface (41) and a second housing side surface (42),
said fan unit housing (40) enclosing at least two fans (50),
the fan unit housing (40) being formed on said first housing side surface (41) and on said second housing side surface (42) with respective fluid passage openings (61, 62), in order to permit flow of a fluid (18) through said fluid passage openings (61, 62);
wherein a fan unit housing surface (42) serves as a bottom surface and at least two mutually adjacent fan unit housing surfaces (43, 44; 44, 45; 45, 46; 46, 43) serve as side walls (43, 44; 44, 45; 45, 46; 46, 43),
said side walls (43, 44; 44, 45; 45, 46; 46, 43) each being connected with the bottom surface (42) and defining a common corner edge (51, 52, 53, 54) of the fan unit housing (40);
wherein two adjacent sidewalls, adjacent the corner (51, 52, 53, 54), define a gap (51', 52', 53', 54') of the fan unit housing (40), in order to hinder touching of the sidewalls at the corner edge (51, 52, 53, 54); and
wherein the gaps (51', 52', 53', 54') between adjacent sidewalls (43, 44; 44, 45, 45, 46; 46, 43) are, at least segmentally dimensioned wider than 0.2 mm.

2. The antenna arrangement of claim 1, wherein the fan unit housing (40) has a housing side surface (42) toward which the antenna (14) is oriented, and
a plurality of openings (62) are formed in said housing side surface (42), a maximum diameter of each of said openings being smaller than 5 cm.

3. The antenna arrangement of claim 1, in which fan unit housing (40) there is provided a controller (57), which is connected via electrical leads with the fans (40), in order to control the fans,
wherein the controller (57) is preferably also electrically connected with a temperature sensor (90).

4. The antenna arrangement of claim 3, wherein the controller (57) has a circuit board (32) adapted to control the at least two fans (50) and
wherein the circuit board (32) is arranged in a circuit board housing (34) and is provided with potting (35), the circuit board housing (34) being formed to serve as a well for said potting (35).

5. The antenna arrangement of claim 4, wherein the potting (35) is adapted to provide IP-protection for the circuit board (32), corresponding to at least class IP55.

6. The antenna arrangement of claim 5, wherein
the circuit board (32) has an elongated extension with a first longitudinal face (37) and a second longitudinal face (38) arranged opposite,
wherein the potting (35) extending from the first longitudinal face (37) has a first thickness (D1) and extending from the second longitudinal face (38) has a second thickness (D2), the first thickness (D1) and the second thickness (D2) differing by no more than 20 percent from each other.

7. The antenna arrangement of claim 3, having an electrical fan unit cable (80), electrically connected to the circuit board (32), and through an opening in the fan unit housing (40), to an exterior of the fan unit housing (40), in order to permit electrical connection to the circuit board from outside.

8. The antenna arrangement according to claim 7, wherein the fan unit cable (80) is fed along two mutually opposing fan unit side walls (41, 42) in order to minimize the likelihood of movement of the fan unit cable (80) within the fan unit housing (40).

9. The antenna arrangement of claim 1, wherein
the fan unit housing (40) has four sidewalls (43, 44, 45, 46);
the four sidewalls are each connected to said bottom surface (42);
each two adjacent sidewalls (43, 44; 44, 45; 45, 46; 46, 43) of the four sidewalls (43,44,45,46) define a common edge (51, 52, 53, 54) of the fan unit housing (40); and
wherein two adjacent sidewalls (43,44; 44, 45; 45, 46; 46,43), adjacent the corner (51, 52, 53, 54), form a gap (51', 52', 53', 54') of the fan unit housing (40), in order to hinder touching of the sidewalls near the edge (51, 52, 53, 54).

10. The antenna arrangement of claim 9, wherein the side walls (43,44; 44, 45; 45, 46; 46, 43) and the bottom surface (42) are composed of a metal sheet and, in a transition zone between the sidewalls (43, 44, 45, 46) and the bottom surface (42),
a bend of the metal sheet is provided.

11. The antenna arrangement of claim 1, wherein at least one sidewall (43) has a wing portion (47) located away from a portion contiguous to the bottom surface (42); and
said wing portion (47) and said bottom surface (42) are bent with respect to each other, in such a manner that they define a space (49) within said fan unit housing (40) which is limited on two opposing sides.

12. The antenna arrangement of claim 1, wherein the gaps (51', 52', 53', 54') between adjacent sidewalls are narrower than 3.0 mm.

13. The antenna arrangement of claim 1, wherein
no direct contact exists between a metallic material of components (50, 57, 80, 82) arranged in said fan unit housing (40) and an inner surface of said metallic material of said fan unit housing (40).

14. An antenna arrangement (10) having an antenna arrangement housing (12) in which are arranged:
an antenna (14);
antenna electronics (16) for driving the antenna (14), and a fan unit (30) for active cooling of the antenna electronics (16);
wherein the fan unit (30) comprises a fan unit housing (40) having a plurality of fan unit housing side surfaces (41-47) including a first housing side surface (41) and a second housing side surface (42),
said fan unit housing (40) enclosing at least two fans (50),
the fan unit housing (40) being formed on said first housing side surface (41) and on said second housing side surface (42) with respective fluid passage openings (61, 62), in order to permit flow of a fluid (18) through said fluid passage openings (61, 62);
wherein a fan unit housing surface (42) serves as a bottom surface and at least two mutually adjacent fan unit housing surfaces (43, 44; 44, 45; 45, 46; 46, 43) serve as side walls (43, 44; 44, 45; 45, 46; 46, 43),
said side walls (43, 44; 44, 45; 45, 46; 46, 43) each being connected with the bottom surface (42) and defining a common corner edge (51, 52, 53, 54) of the fan unit housing (40);
wherein two adjacent sidewalls, adjacent the corner (51, 52, 53, 54), define a gap (51', 52', 53', 54') of the fan unit housing (40), in order to hinder touching of the sidewalls at the corner edge (51, 52, 53, 54);
wherein the fan unit housing (40) has a cover (70) which is attachable to the sidewalls (43, 44, 45, 46) in an orientation such that it aligns opposing said bottom surface (42); and
wherein the cover (70) is composed of a glass-fiber-reinforced plastic.

15. The antenna arrangement of claim 14, wherein the cover (70) has at least one spacer element (76,77,78,79) which is configured to limit movement of two adjacent sidewalls (43, 44; 44, 45, 45, 46; 46, 43) toward each other, and thereby to discourage contact between the sidewalls (43, 44, 45, 46) at the gaps (51', 52', 53', 54');
said at least one spacer element (76, 77 78, 79) abutting against both adjacent sidewalls.

16. The antenna arrangement of claim 14, wherein the fans (50) secured in the fan unit housing (40) have a rotor pot (111) with a rotor pot floor (113) and a rotor pot sidewall (114) and
wherein the fan unit housing (40) is so arranged in the antenna arrangement housing (12) that the rotor pot sidewall (114) is arranged on an antenna-adjacent side of the rotor pot floor (113).

17. The antenna arrangement according to claim 14, wherein
the at least two fans (50) each have a fan housing;
the fan housing is connected via a fan housing connecting element (86) to a fan unit housing side surface (42); and
the fan housing connecting element (86) is composed of plastic.

18. The antenna arrangement according to claim 17, wherein the fan housing connecting element (86) is an expanding rivet, inserted from an outer face of the fan unit housing (40) through an aperture (99) of the fan unit housing (40) into a fastener opening (94) of the fan housing (91).

19. The antenna arrangement of claim 17, wherein the fans (50) have a fan cable (92), the fan cable (92) of the fans (50) being secured to at least one fan unit housing side surface (42) by a cable fastener element (83) composed of plastic, in order to reduce the likelihood of movement of the fan cable (82) in the fan unit housing (40).

20. The antenna arrangement of claim 19, wherein the cable fastening element (83) includes a cable binder (84) and a latching element (85); the cable binder (84) encloses the fan cable (82) and the latching element (85) engages with a cutout (100) in the fan housing (40).

21. The antenna arrangement of claim 14, wherein at least that one (42) of the fan unit housing side surfaces which faces the antenna (14) is formed of a metallic material, in order to serve as screening against electromagnetic noise emanating from the fan unit (30).

22. The antenna arrangement of claim 14, wherein
the fans (40) each comprise a rotor pot (114) with a rotor pot bottom (113) and a fan circuit board (116) with an electronic component (118); and
the fan circuit board (116) is arranged within the rotor pot (114), in order for the rotor pot (114) to shield the fan circuit board.

23. The antenna arrangement of claim 14, wherein
the second fan unit housing side surface (42) is arranged facing the first fan unit housing side surface (41).

24. The antenna arrangement of claim 14, which is mounted on a transmitter mast (11).

25. An antenna arrangement (10) having an antenna arrangement housing (12) in which are arranged:
an antenna (14);
antenna electronics (16) for driving the antenna (14), and a fan unit (30) for active cooling of the antenna electronics (16);
wherein the fan unit (30) comprises a fan unit housing (40) having a plurality of fan unit housing side surfaces (41-47) including a first housing side surface (41) and a second housing side surface (42),
said fan unit housing (40) enclosing at least two fans (50),
the fan unit housing (40) being formed on said first housing side surface (41) and on said second housing side surface (42) with respective fluid passage openings (61, 62), in order to permit flow of a fluid (18) through said fluid passage openings (61, 62);
wherein a fan unit housing surface (42) serves as a bottom surface and at least two mutually adjacent fan unit housing surfaces (43, 44; 44, 45; 45, 46; 46, 43) serve as side walls (43, 44; 44, 45; 45, 46; 46, 43),
said side walls (43, 44; 44, 45; 45, 46; 46, 43) each being connected with the bottom surface (42) and defining a common corner edge (51, 52, 53, 54) of the fan unit housing (40);
wherein two adjacent sidewalls, adjacent the corner (51, 52, 53, 54), define a gap (51', 52', 53', 54') of the fan unit housing (40), in order to hinder touching of the sidewalls at the corner edge (51, 52, 53, 54);
wherein the fan unit housing (40) has a cover (70) which is attachable to the sidewalls (43, 44, 45, 46) in an orientation such that it aligns opposing said bottom surface (42); and
wherein the cover (70) has a shell configuration,
an inner region (71) of the shell (70) being raised with respect to at least one portion of an outer rim (72) of the shell (70);

the raised portion has a flank (73); and with reference to an exterior surface of the fan unit housing (40), the raised portion is elevated with respect to said exterior surface.

26. The antenna arrangement of claim 25, wherein the flank (73) is formed with a wavy contour, in order to achieve a stiffening of the shell (70).

27. The antenna arrangement of claim 26, wherein fluid flow openings (61) are formed adjacent the flank (73).

28. The antenna arrangement of claim 25, wherein said inner region (71) is formed with fluid flow openings (61) for a plurality of fans (50).

29. The antenna arrangement of claim 25, wherein a plateau is formed in said inner region (71) and wherein, adjacent said plateau, fluid flow openings (61) are formed for a plurality of fans (50).

\* \* \* \* \*